(12) United States Patent
Watanabe et al.

(10) Patent No.: US 11,357,144 B2
(45) Date of Patent: Jun. 7, 2022

(54) COMPONENT SUPPLY DEVICE AND COMPONENT MOUNTING DEVICE

(71) Applicant: Panasonic Intellectual Property Management Co., Ltd., Osaka (JP)

(72) Inventors: Hideaki Watanabe, Fukuoka (JP); Dai Yokoyama, Yamanashi (JP); Shigeki Imafuku, Yamanashi (JP); Yosuke Nagasawa, Yamanashi (JP); Satoshi Matsuoka, Yamanashi (JP); Kazuo Nagae, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 714 days.

(21) Appl. No.: 16/161,051

(22) Filed: Oct. 16, 2018

(65) Prior Publication Data
US 2019/0133007 A1    May 2, 2019

(30) Foreign Application Priority Data

Oct. 31, 2017    (JP) .............................. JP2017-210681

(51) Int. Cl.
*H05K 13/02*    (2006.01)
*H05K 13/04*    (2006.01)
(Continued)

(52) U.S. Cl.
CPC .............. *H05K 13/029* (2013.01); *B21C 1/00* (2013.01); *H05K 13/0406* (2018.08);
(Continued)

(58) Field of Classification Search
CPC .. H05K 13/022; H05K 13/023; H05K 13/028; H05K 13/029; H05K 13/0406;
(Continued)

(56) References Cited

U.S. PATENT DOCUMENTS 3,594,889 A * 7/1971 Clark ................. H05K 13/0426
227/90

FOREIGN PATENT DOCUMENTS

JP    08133446 A  *  5/1996
JP    2015-037084    2/2015

OTHER PUBLICATIONS

Chung-Hsien Kuo, Jein-Jong Wing and MuDer Jeng, "Production modeling and simulation of surface mounting technology assembly industries using distributed agent oriented Petri net," Proceedings. 2005 IEEE Networking, Sensing and Control, 2005., 2005, pp. 761-766, doi: 10.1109/ICNSC.2005.1461286. (Year: 2005).*

* cited by examiner

Primary Examiner — A. Dexter Tugbang
(74) Attorney, Agent, or Firm — Pearne & Gordon LLP (57) ABSTRACT

A component supply device includes a transport path that guides a component connected body from a component insertion port on an upstream side in a component feeding direction to a component supply position on a downstream side, the component connected body including a plurality of axial components arranged and connected at a predetermined pitch, the plurality of axial components each having a lead, and a feed mechanism that pitch-feeds the component connected body along the transport path to the downstream side. The feed mechanism includes a feed member which has a plurality of feed hooks disposed at the predetermined pitch along the component feeding direction, a rotating shaft which is connected to one end side of the feed member, and a moving mechanism which is connected to the feed member through the rotating shaft and reciprocates the rotating shaft along the component feeding direction. A length of one feed hook among the plurality of feed hooks is longer than a length of an other feed hook among the plurality of feed
(Continued)

hooks, the other feed hook being adjacent to the one feed hook on the rotating shaft side.

11 Claims, 10 Drawing Sheets

(51) Int. Cl.
*H05K 13/08* (2006.01)
*B21C 1/00* (2006.01)

(52) U.S. Cl.
CPC ....... *H05K 13/0426* (2013.01); *H05K 13/084* (2018.08); *H05K 13/0812* (2018.08); *H05K 13/022* (2013.01); *H05K 13/023* (2013.01); *H05K 13/028* (2013.01); *H05K 13/0421* (2013.01); *H05K 13/0439* (2013.01)

(58) Field of Classification Search
CPC ........... H05K 13/0421; H05K 13/0426; H05K 13/0439; H05K 13/0812; H05K 13/084; B21C 1/00
See application file for complete search history.

FIG. 11C

COMPONENT SUPPLY DEVICE AND COMPONENT MOUNTING DEVICE

BACKGROUND

1. Technical Field

The present disclosure relates to a component supply device that supplies an axial component in which a lead extends from both end portions of a component body to an outside, a component mounting device that mounts the axial component on a board, and a method of manufacturing a mounting board on which the axial component is mounted.

2. Description of the Related Art

An axial component serving as an electronic component has a structure in which a lead extends outward from each of both end portions of a component body. The axial component is provided as a component connected body in which a plurality of axial components are arranged at a predetermined pitch and each of the tip portions of the left and right leads is connected with a tape. There is known a component supply device (component feeder) supplying the axial components in which the component connection bodies are pitch-fed, the left and right leads are cut at a predetermined position and separated from the tape, and the left and right leads are foot-bent (for example, refer to Japanese Patent Unexamined Publication No. 2015-37084). In a component mounting device, the axial component supplied by the component feeder is taken out by a mounting head, and the left and right leads of the foot-bent axial component are inserted into through-holes formed in a board and mounted on the board.

A component feeder described in Japanese Patent Unexamined Publication No. 2015-37084 pitch-feeds the component connected body at a predetermined pitch from an upstream side to a downstream side in a component feeding direction by a built-in feed mechanism. The feed mechanism is provided with a feed member having a plurality of feed hooks formed at a predetermined pitch in the component feeding direction and an air cylinder reciprocating the feed member in the component feeding direction. The upstream side of the feed member is connected to a shaft of the air cylinder through a rotating shaft.

The feed mechanism pitch-feeds the component connected body to the downstream side by moving each of the feed member engaged with the lead of the axial component to which a plurality of feed hooks are connected as a component connected body to the downstream side. In addition, when the feed member which has moved to the downstream side returns to the upstream side, the feed mechanism rotates on the downstream side and the engagement between the feed hook and the lead is released, so that it is possible to return only the feed member to an original position on the upstream side without moving the component connected body.

SUMMARY

A component supply device of the disclosure includes a transport path that guides a component connected body from a component insertion port on an upstream side in a component feeding direction to a component supply position on a downstream side, the component connected body including a plurality of axial components arranged and connected at a predetermined pitch, the plurality of axial components each having a lead, and a feed mechanism that pitch-feeds the component connected body along the transport path to the downstream side. The feed mechanism includes a feed member which has a plurality of feed hooks disposed at the predetermined pitch along the component feeding direction, a rotating shaft which is connected to one end side of the feed member, and a moving mechanism which is connected to the feed member through the rotating shaft and reciprocates the rotating shaft along the component feeding direction. A length of one feed hook among the plurality of feed hooks is longer than a length of an other feed hook among the plurality of feed hooks, the other feed hook being adjacent to the one feed hook on the rotating shaft side.

A component mounting device of the disclosure includes the above component supply device, and a mounting head that holds the plurality of axial components supplied by the component supply device to mount the axial components on a board.

A method of manufacturing a mounting board of the disclosure is a method of manufacturing a mounting board by a component mounting device that holds a plurality of axial components supplied by a component supply device which picks up and supplies each of the plurality of axial components from a component connected body in which the plurality of axial components are arranged and connected at a predetermined pitch, by a mounting head and mounts the axial components on a board, the plurality of axial components each having a lead. The component supply device includes a transport path that guides the component connected body from a component insertion port on a upstream side in a component feeding direction to a component supply position on a downstream side, and a feed mechanism that pitch-feeds the component connected body along the transport path to the downstream side. The feed mechanism includes a feed member which has a plurality of feed hooks disposed at the predetermined pitch along the component feeding direction, a rotating shaft which is connected to one end side of the feed member, and a moving mechanism which is connected to the feed member through the rotating shaft and reciprocates the rotating shaft along the component feeding direction. A length of one feed hook among the plurality of feed hooks is longer than a length of an other feed hook among the plurality of feed hooks, the other feed hook being adjacent to the one feed hook on the rotating shaft side. The method of manufacturing a mounting board includes a component connected body moving step of moving the feed member to the downstream side by a moving mechanism to move a component connected body to the downstream side, in a state where a feed surface formed on the downstream side of each of a plurality of feed hooks is in contact substantially perpendicularly with the lead from the upstream side, a feed member returning step of moving the feed member to the upstream side by the moving mechanism while dispersing a load applied from the feed member to the lead, and returning the feed member, a component picking up step of picking up the axial component moved to the component supply position by the mounting head, a mounting head moving step of moving the mounting head holding the axial component above a board, and a component mounting step of mounting the axial component held by the mounting head on the board.

According to the disclosure, it is possible to supply the axial component without lowering a reliability.

DETAILED DESCRIPTION

In a component feeder described in Japanese Patent Unexamined Publication No. 2015-37084, when returning a feed member to an upstream side, there is a problem that a load of the rotating feed member is concentrated on a portion of a lead through a feed hook and the lead is bent to lower reliability of an axial component.

Therefore, it is an object of the disclosure to provide a component supply device, a component mounting device, and a method of manufacturing a mounting board that can supply an axial component without lowering reliability.

Figure 1:
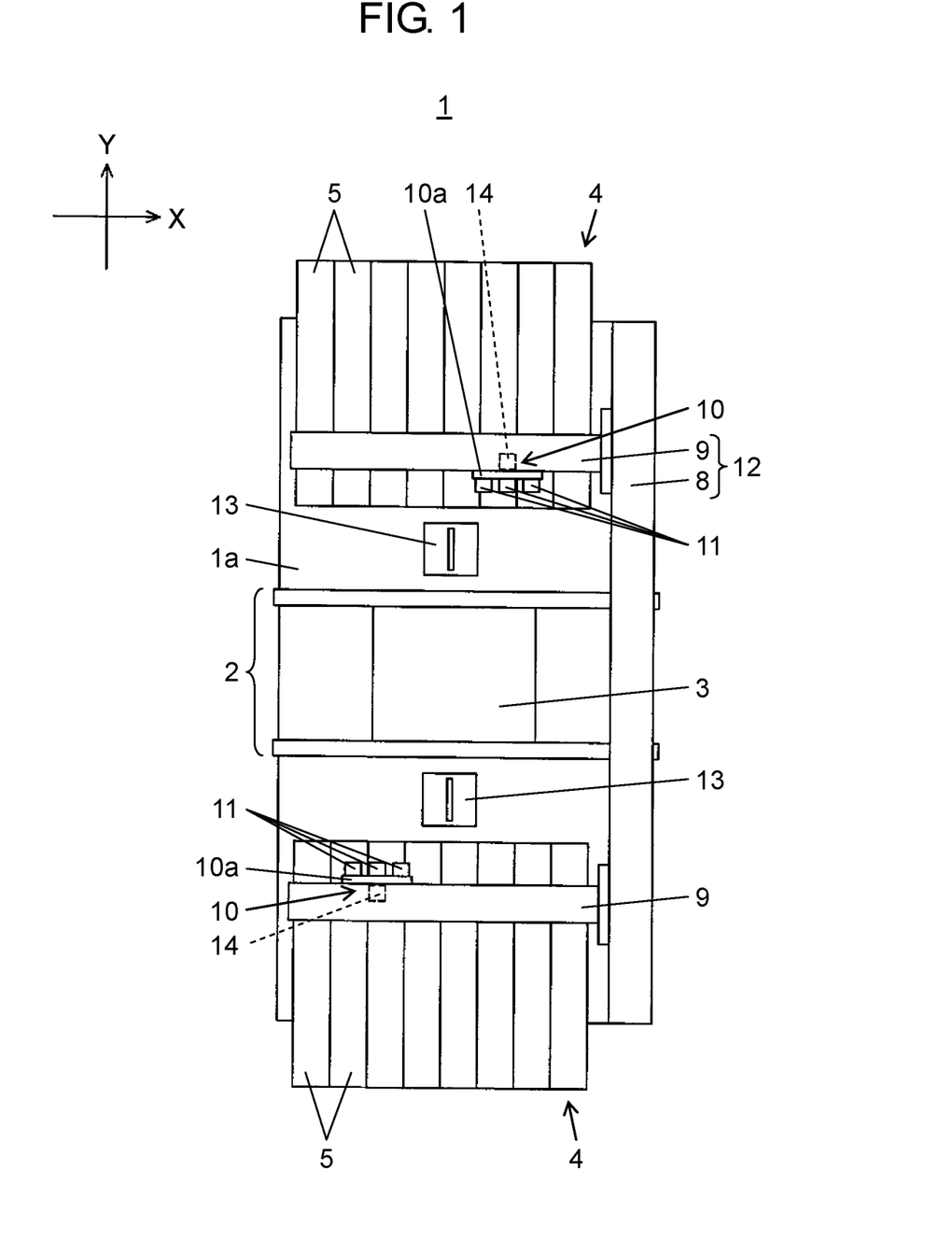
FIG. 1 is a plan view illustrating a configuration of a component mounting device according to an exemplary embodiment of the present disclosure.
Figure 3:
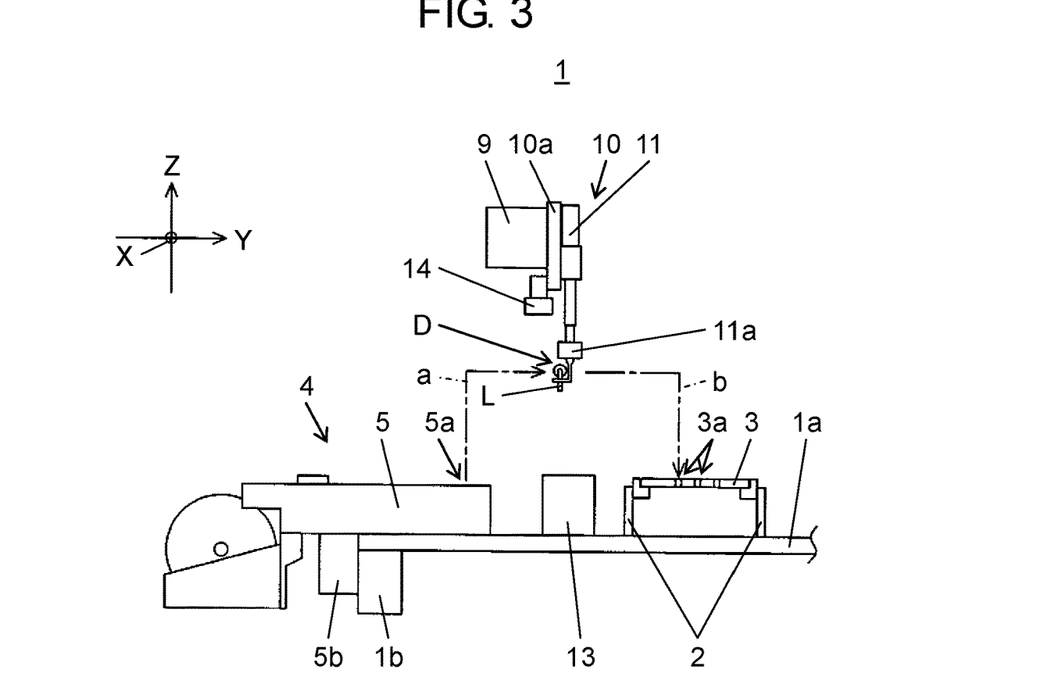
FIG. 3 is a partial cross-sectional view of the component mounting device according to the exemplary embodiment of the present disclosure.

An exemplary embodiment of the disclosure will be described in detail below with reference to the drawings. A configuration, a shape, and the like described below are examples for description and can be appropriately changed in accordance with the specifications of the component mounting device. Hereinafter, the same reference numerals are given to the corresponding elements in all drawings, and redundant descriptions are not repeated. In FIG. 1 and in a part to be described later, an X direction (horizontal direction in FIG. 1) in a board transport direction and a Y direction (vertical direction in FIG. 1) orthogonal to the board transport direction are illustrated as two axis directions orthogonal to each other in a horizontal plane. In FIG. 3 and in a part to be described later, a Z direction (vertical direction in FIG. 3) is illustrated as a height direction orthogonal to the horizontal plane. The Z direction is the vertical direction in a case where the component mounting device is installed on the horizontal plane.

Figure 2:
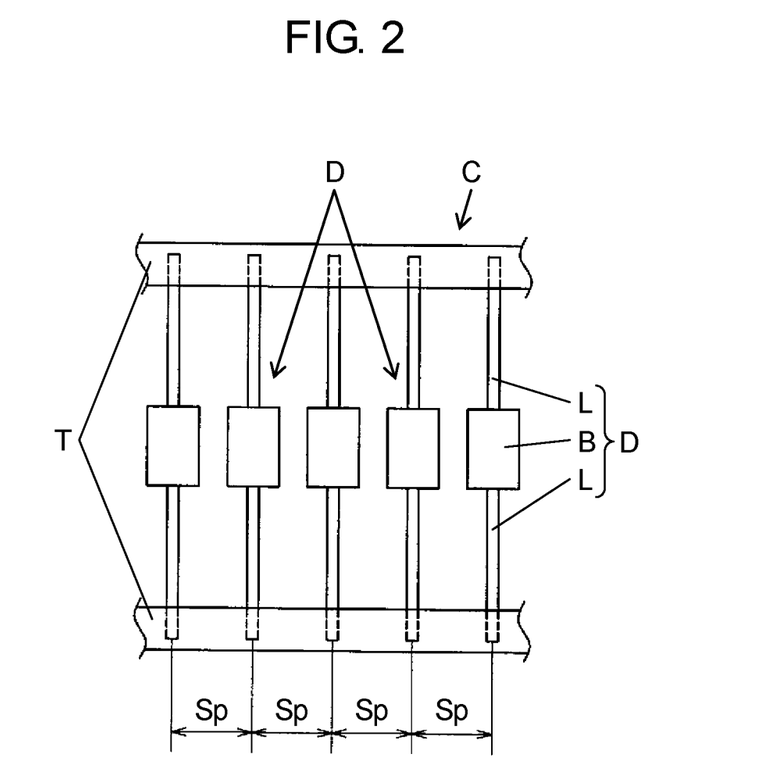
FIG. 2 is a configuration explanatory diagram of a component connected body to be inserted into a component supply device according to the exemplary embodiment of the present disclosure.

First, the configuration of component mounting device 1 will be described with reference to FIGS. 1 to 3. In FIG. 1, board transport mechanism 2 is installed in the X direction at a center of base 1a. Board transport mechanism 2 transports board 3 transported in from the upstream in the X direction, positions, and holds board 3 at a mounting operation position by a mounting head to be described below. In addition, board transport mechanism 2 transports out board 3 on which a component mounting operation is completed to the downstream. Component suppliers 4 are installed on both sides of board transport mechanism 2, respectively.

In component supplier 4, a plurality of component feeders 5 are mounted in parallel in the X direction. Component feeder 5 is a component supply device that feeds the axial component to a component supply position by pitch-feeding the component connected body connecting and holding the axial components to be described later in the direction from the outside of component supplier 4 to board transport mechanism 2 (component feeding direction).

Here, with reference to FIG. 2, component connected body C in which axial component D and axial component D are connected and held will be described. Axial component D includes component body B and left and right leads L extending outward from both end portions of component body B. In component connected body C, a plurality of axial components D are arranged at predetermined pitch Sp and the end portions of the left and right leads L are held by each of tapes T, so that the plurality of axial components D are connected to each other. That is, each of the plurality of axial components D has lead L.

In FIG. 1, Y-axis beam 8 provided with a linear drive mechanism is installed along the Y direction at one end in the X direction on the upper surface of base 1a. Similarly, each of two X-axis beams 9 provided with linear drive mechanisms is coupled to Y-axis beam 8 so as to be movable in the Y direction. Mounting head 10 is mounted to each of X-axis beams 9 so as to be movable in the X direction. Mounting head 10 is provided with a plurality of component holding units 11 (three in here). Y-axis beam 8 and X axis beam 9 form head moving mechanism 12 for moving mounting head 10 in the horizontal direction (X direction, Y direction).

In FIG. 3, component feeder 5 is mounted on base 1a in a state where feeder side connecting portion 5b provided in component feeder 5 and device side connecting portion 1b provided in base 1a are connected to each other. Feeder side connecting portion 5b and device side connecting portion 1b are connected to each other. Therefore, component feeder 5 is electrically connected to component mounting device 1, and air (compressed air) is supplied to component feeder 5. Component holder 11a that holds lead L of axial component D subjected to foot bending processing and supplied by component feeder 5 is mounted at the lower end of each component holding unit 11.

In a component mounting operation, mounting head 10 moves above component feeder 5 by head moving mechanism 12, and axial component D subjected to the foot bending processing and supplied to component supply position 5a of component feeder 5 is held and picked up by component holder 11a (arrow a). Mounting head 10 holding axial component D moves above board 3 held at a mounting operation position of board transport mechanism 2 by head moving mechanism 12, and inserts lead L into through-hole 3a formed on board 3 to mount axial component D (arrow b).

In FIG. 1, component recognition camera 13 is installed between component supplier 4 and board transport mechanism 2. When mounting head 10 which picks up axial component D from component supplier 4 moves above component recognition camera 13, component recognition camera 13 images and recognizes axial component D held by mounting head 10. On coupling plate 10a to which mounting head 10 is attached, board recognition camera 14 that is positioned on the lower surface side of X-axis beam 9 and moves integrally with mounting head 10 is mounted.

As mounting head 10 moves, board recognition camera 14 moves above board 3 positioned in board transport mechanism 2 to image a board mark (not illustrated) provided on board 3 and recognize the position of board 3. In addition, board recognition camera 14 images through-hole 3a formed on board 3 and recognizes the position of through-hole 3a. In the component mounting operation of axial component D onto board 3 by mounting head 10, the mounting position is corrected taking into consideration of a recognition result of axial component D by component recognition camera 13 and a recognition result of board 3 and through-hole 3a by board recognition camera 14.

Next, with reference to FIG. 4, the configuration of component feeder 5 will be described. Component feeder 5 is provided with main body portion 5c, feeder side connecting portion 5b, and reel holder 5d. Feeder side connecting portion 5b is installed on the lower surface of main body portion 5c. Reel holder 5d is installed on the upstream side (left side in FIG. 4) in the component feeding direction of main body portion 5c. On reel holder 5d, reel 21 winding and accommodating component connected body C inserted from component insertion port 5e provided on the upstream side of main body portion 5c is placed.

Figure 4:
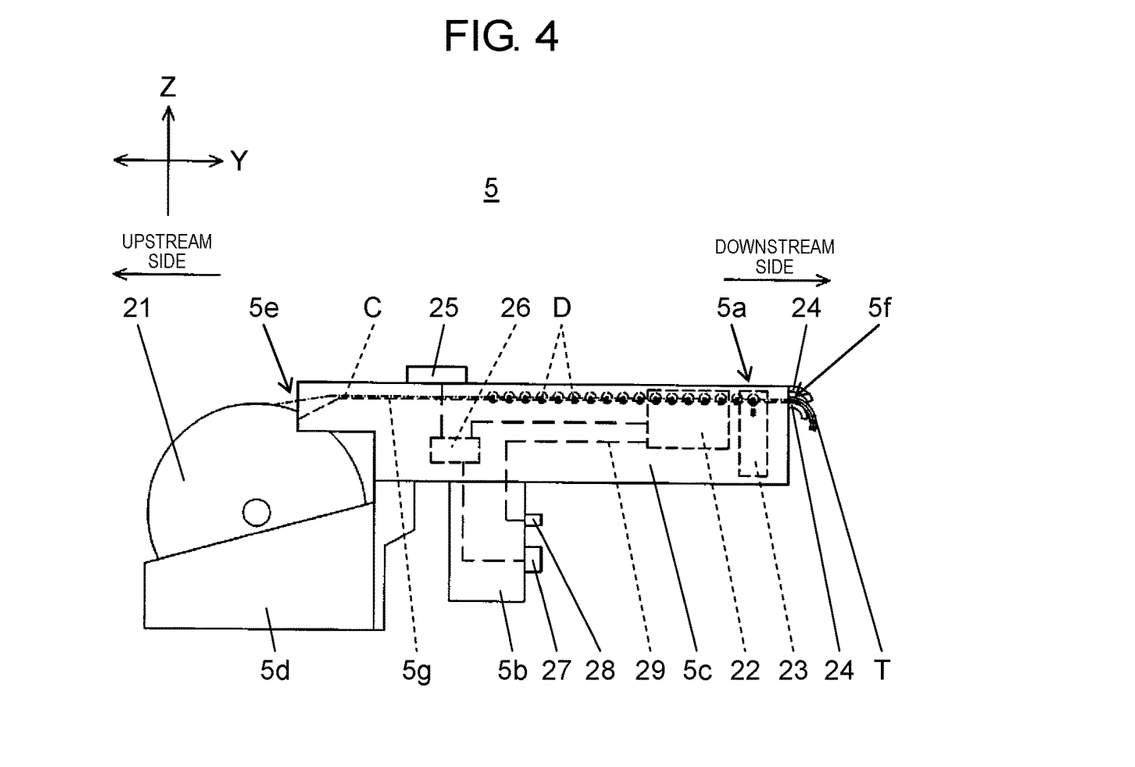
FIG. 4 is a configuration explanatory diagram of the component supply device according to the exemplary embodiment of the present disclosure.

A pair of left and right transport paths 5g guiding component connected body C is substantially horizontally provided inside main body portion 5c from component insertion port 5e opening to the upstream side to discharge port 5f opening to the downstream side in the component feeding direction (right side in FIG. 4). In component connected body C, left and right tapes T forming component connected body C are pitch-fed to the downstream side in a state of being placed on left and right transport paths 5g. In the middle of transport path 5g, component supply position 5a is provided. That is, transport path 5g guides component connected body C from component insertion port 5e on the upstream side to component supply position 5a on the downstream side in the component feeding direction.

In FIG. 4, feed mechanism 22 and foot bending mechanism 23 are installed inside main body portion 5c. Feed mechanism 22 pitch-feeds component connected body C to the downstream side along transport path 5g. The detailed configuration of feed mechanism 22 will be described later. Foot bending mechanism 23 is installed on the downstream side of feed mechanism 22. Foot bending mechanism 23 cuts left and right leads L of pitch-fed axial component D at predetermined positions, disconnects lead L from tape T, executes the foot bending processing of bending lead L left in component body B downward, and supplies lead L to component supply position 5a.

Tape T from which axial component D is cut off is discharged from discharge port 5f. On the downstream side of discharge port 5f, a pair of upper and lower tape discharge guides 24 are installed (refer to FIG. 5). Tape T discharged from discharge port 5f is discharged downward along the pair of tape discharge guides 24. Operation and display panel 25 is installed on the upper surface on the upstream side of main body portion 5c. Operation and display panel 25 is provided with an operation button for an operator to perform predetermined operation input and display means such as a 7-segment display for displaying a predetermined content.

In FIG. 4, feeder controller 26 is installed inside main body portion 5c. On the side surface on the downstream side of feeder side connecting portion 5b, socket 27 and air supply port 28 are installed. Feeder controller 26 is electrically connected to feed mechanism 22, foot bending mechanism 23, operation and display panel 25, and socket 27. Feeder controller 26 is electrically connected to device side connecting portion 1b through socket 27. Air is supplied to air supply port 28 through device side connecting portion 1b. The air supplied to air supply port 28 is supplied to feed mechanism 22 and foot bending mechanism 23 by tube 29 installed inside main body part 5c.

Figure 5:
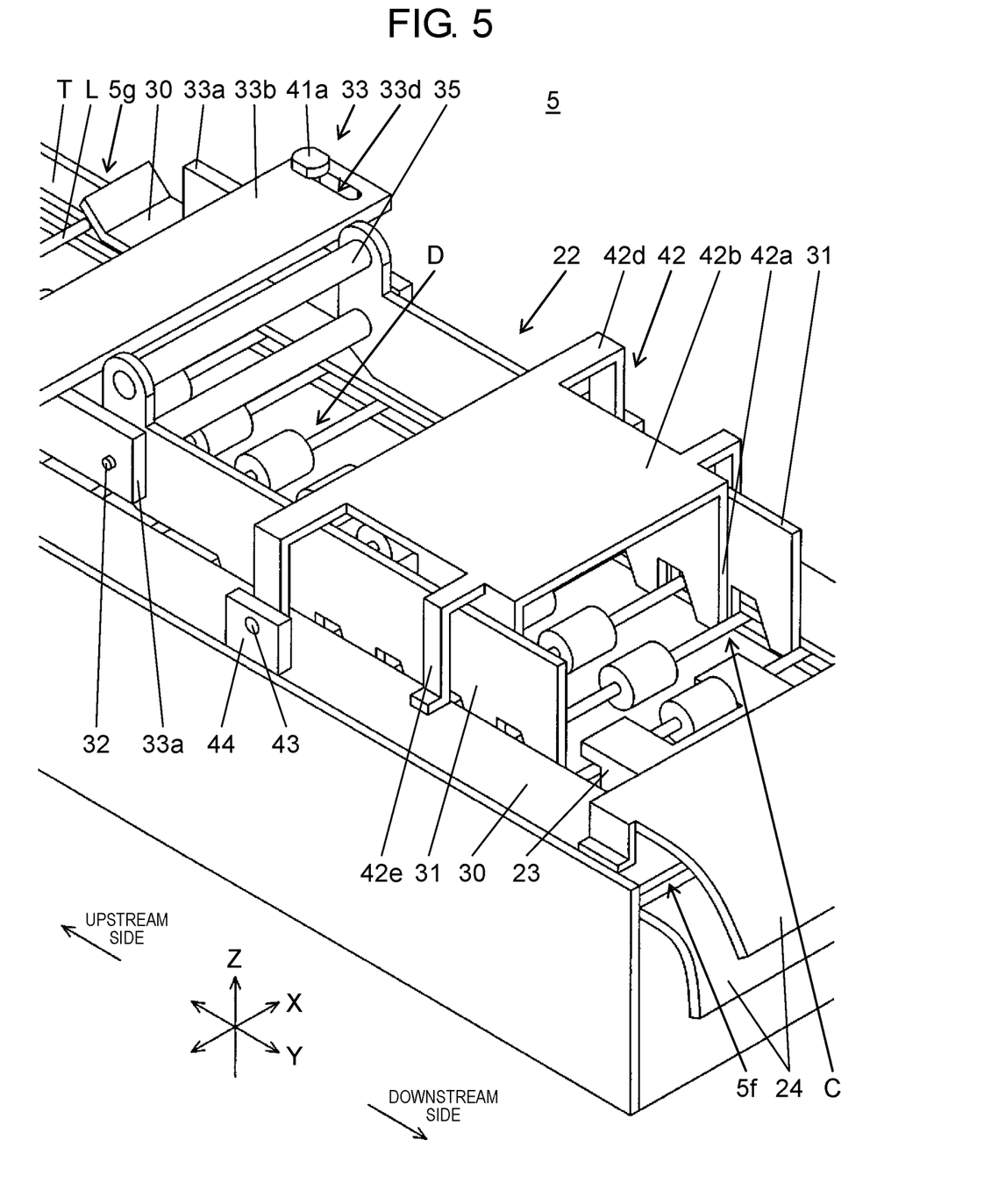
FIG. 5 is a perspective view illustrating a configuration in a vicinity of a feed mechanism of the component supply device according to the exemplary embodiment of the present disclosure.

Next, the configuration of feed mechanism 22 will be described with reference to FIGS. 5, 6A, and 6B. In FIG. 5, transport path cover 30 is installed above each of the right and left transport paths 5g from a portion of feed mechanism 22 to discharge port 5f. Between the upper surface of transport path 5g and the lower surface of transport path cover 30, a gap through which lead L held by tape T of component connected body C can move is formed. Component connected body C is regulated in movement in the Z direction (vertical direction) by transport path 5g and transport path cover 30 and moves along transport path 5g.

Figure 6A:
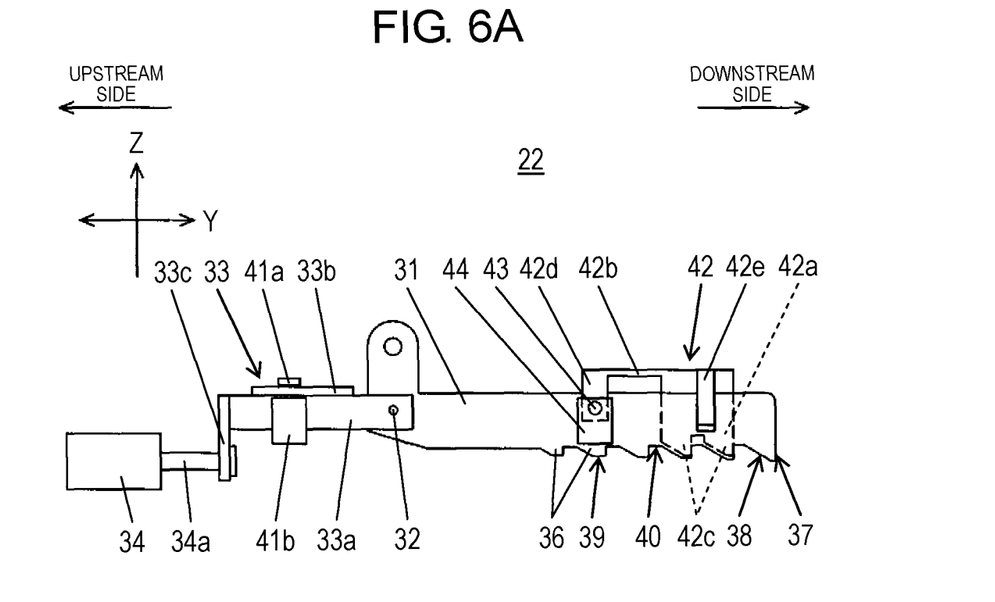
FIG. 6A is a side view illustrating a configuration of the feed mechanism of the component supply device according to the exemplary embodiment of the present disclosure.
Figure 6B:
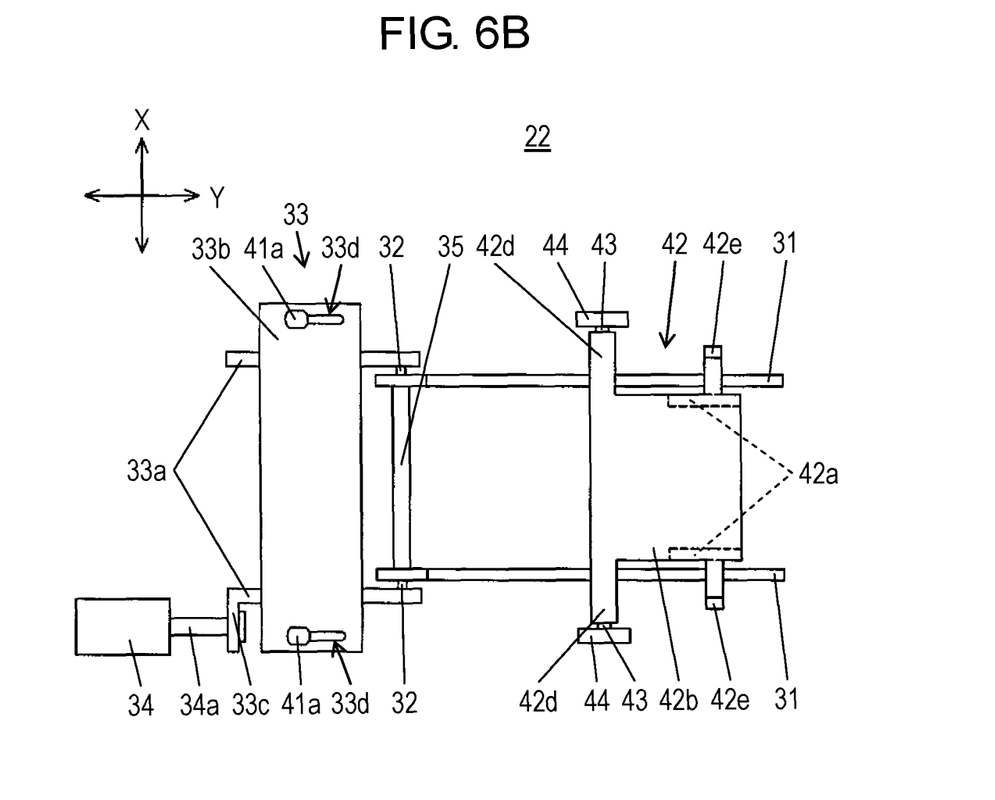
FIG. 6B is a plan view illustrating a configuration of the feed mechanism of the component supply device according to the exemplary embodiment of the present disclosure.

In FIGS. 6A and 6B, feed mechanism 22 is configured to include left and right feed members 31, rotating shaft 32, connecting member 33, and air cylinder 34. Rotating shaft 32 has a rotating shaft extending in the X direction (direction perpendicular to component feeding direction in horizontal plane). In feed member 31, the upstream side is connected to connection member 33 through rotating shaft 32, and the downstream side rotates up and down about the rotation axis of rotating shaft 32. Air cylinder 34 is connected to connecting member 33, and reciprocates connecting member 33 along the component feeding direction (Y direction).

In FIGS. 5, 6A, and 6B, feed member 31 has a flat plate shape extending in the component feeding direction and in the Z direction. Each of left and right feed members 31 is coupled to spacers 35 so as to be positioned between left and right transport paths 5g. At the lower portion of feed member 31 on the opposite side (downstream side) of rotating shaft 32 side, a plurality of feed hooks 36 are formed to protrude downward at the same interval as pitch Sp of lead L of component connected body C (refer to FIG. 7A).

In FIGS. 6A and 6B, substantially vertical feed surface 37 is formed on the downstream side of each of feed hooks 36. On the upstream side of each of feed hooks 36, inclined surface 38 rising to the upstream side is formed. In each of feed hooks 36, substantially horizontal projection end surface 39 is formed on projection end portion between feed surface 37 and inclined surface 38. Between feed hooks 36, substantially horizontal recessed surfaces 40 are respectively formed. As described above, a plurality of feed hooks 36 are formed on feed member 31 with pitch Sp along the component feeding direction. Feed member 31 is urged in a direction where the downstream side rotates downward by an elastic body such as a spring (not illustrated), and engages with lead L of component connected body C from above.

In FIGS. 5, 6A, and 6B, connecting member 33 is provided with left and right holding members 33a holding rotating shaft 32 and bridging plate 33b installed on the upper surfaces of left and right holding members 33a. Coupling portion 33c is formed at an end portion on the upstream side of one holding member 33a. Rod 34a of air cylinder 34 is coupled to coupling portion 33c of connecting member 33. When air cylinder 34 moves rod 34a in and out, rotating shaft 32 reciprocates along the component feeding direction (Y direction) through connecting member 33.

At the left and right end portions of bridging plate 33b, regulating hole 33d extending long in the component feeding direction is formed penetrating bridging plate 33b. In regulating hole 33d, regulating pin 41a is inserted from above. Regulating pin 41a is fixed to main body portion 5c of component feeder 5 by pin fixing member 41b installed below bridging plate 33b. When connecting member 33 reciprocates along the component feeding direction, regulating pin 41a is in contact with the inner wall on the downstream side and the inner wall on the upstream side of regulating hole 33d, so that connecting member 33 stops at stop positions on the upstream side and the downstream side. An interval between the stop position on the upstream side and the stop position on the downstream side is set to be substantially the same as pitch Sp of lead L of component connected body C.

As described above, connecting member 33 and air cylinder 34 are connected to one end side (upstream side) of feed member 31 through rotating shaft 32, and are moving mechanisms for reciprocating rotating shaft 32 at pitch Sp along the component feeding direction. The moving mechanism is not limited to a configuration in which rotating shaft 32 (feed member 31) is moved by air (compressed air). For example, rotating shaft 32 may be reciprocated by an electric actuator.

In FIGS. 5, 6A, and 6B, stopper member 42 is installed at a position overlapping with feed member 31 in the component feeding direction. Stopper member 42 is provided with left and right stoppers 42a with flat plate shape. Each of Left and right stoppers 42a is coupled to upper plate 42b so as to be positioned between component body B of axial component D connected as component connected body C and left and right feed members 31. Two stopper hooks 42c are formed below stopper 42a. Similarly to feeding hook 36 of feed member 31, stopper hook 42c has a shape in which a substantially vertical restraining surface is formed on the downstream side and a releasing surface rising upstream on the upstream side is formed. Two stopper hooks 42c are formed at positions overlapping with feed hooks 36 of feed member 31 at the same interval as pitch Sp of lead L of component connected body C.

On the left and right sides on the upstream side of stopper member 42, extending portions 42d are formed to straddle each of left and right feed members 31. Each of left and right extending portions 42d is connected to left and right fixing members 44 through rotation axes 43 extending in the X direction. Left and right fixing members 44 are fixed to main body portion 5c of component feeder 5 while holding rotation axes 43. Stopper member 42 is urged in a direction where the downstream side rotates downward by an elastic body such as a spring (not illustrated). Regulating portions 42e which are in contact with the upper surface of transport path cover 30 to regulate downward rotation of stopper member 42 are formed at the left and right ends of upper plate 42b.

When component connected body C is pitch-fed to the downstream side, stopper member 42 does not hinder the movement of component connected body C because lead L moving to the downstream side is in contact with the releasing surface on the upstream side of stopper hook 42c to rotate stopper 42a upward. On the other hand, when component connecting body C tries to move (tries to return) to the upstream side following feed member 31 moving to the upstream side, in stopper member 42, the restraining surface on the downstream side of stopper hook 42c is in contact substantially vertically with lead L to restrain the movement of component connected body C. That is, stopper member 42 forms a retraction restraint mechanism that restricts movement to the upstream side without hindering movement of component connected body C toward the downstream side. Stopper member 42 is disposed at a position overlapping with feed member 31, so that the length of component feeder 5 in the component feeding direction can be reduced.

Figure 7A:
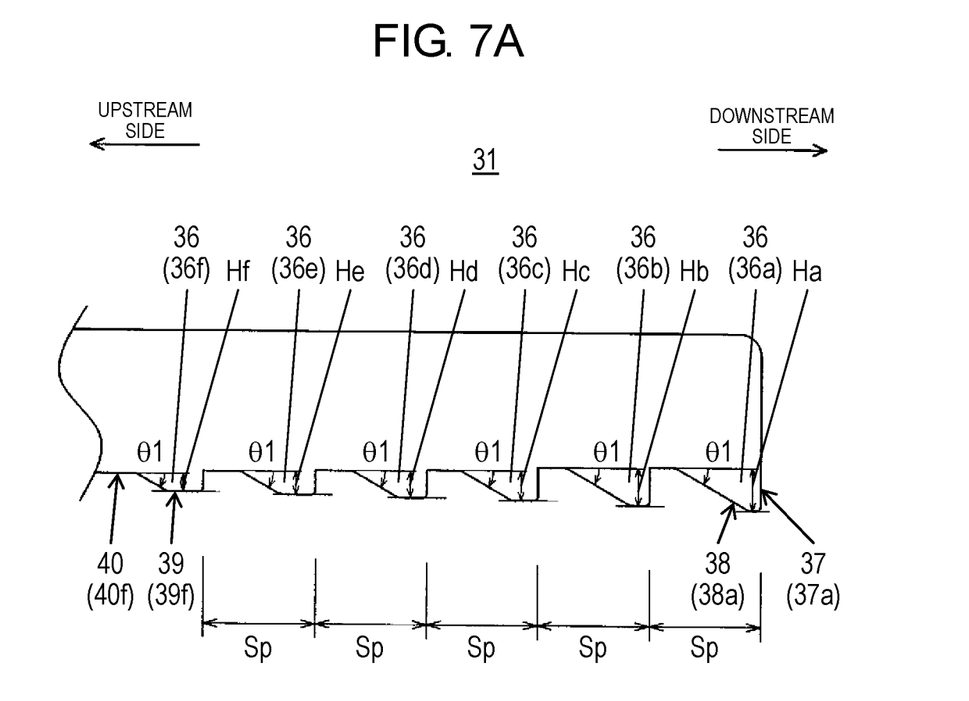
FIG. 7A is an explanatory diagram of sizes of a plurality of feed hooks formed on a feed member provided in the component supply device according to the exemplary embodiment of the present disclosure.
Figure 7B:
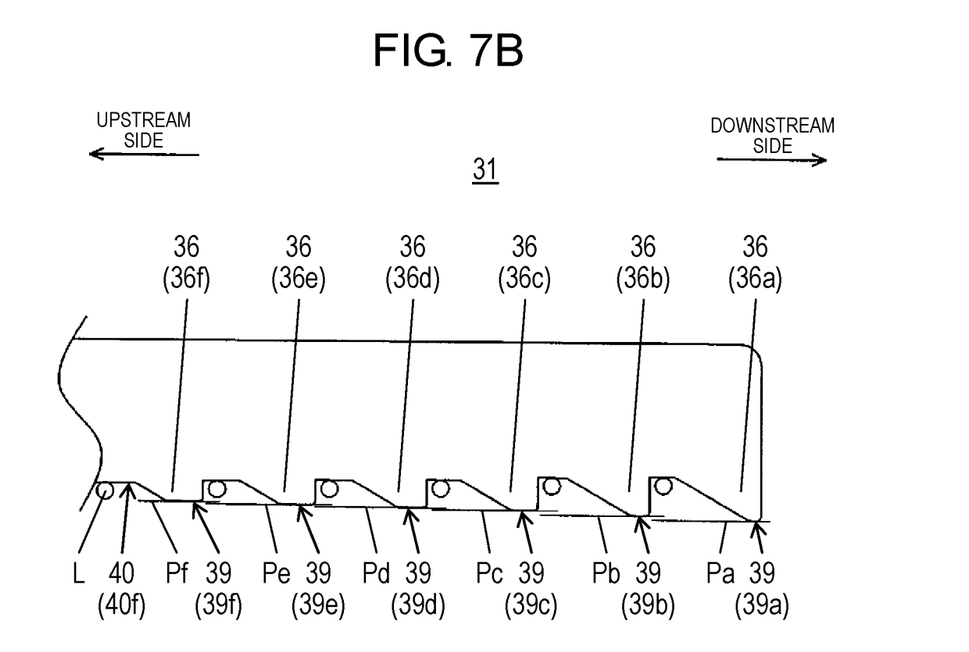
FIG. 7B is an explanatory diagram of height positions of the plurality of feed hooks in a state where the feed member is engaged with a lead of an axial component provided in the component supply device according to the exemplary embodiment of the present disclosure.

Next, with reference to FIGS. 7A and 7B, the shape of feed hook 36 of feed member 31 will be described. In the example of feed member 31 illustrated in FIGS. 7A and 7B, six feed hooks 36 are formed at the same interval as pitch Sp of lead L of component connected body C. In FIGS. 7A and 7B, suffixes a to f are added in order from the downstream side to the reference numerals attached to feed hook 36 and each surface formed on feed hook 36.

In FIG. 7A, substantially vertical feed surfaces 37a to 37f are formed on the downstream side of each of feed hooks 36a to 36f. When feed member 31 moves to the downstream side, feed surfaces 37a to 37f are in contact substantially vertically with lead L of axial component D connected as component connected body C from the upstream side to move component connected body C to the downstream side (refer to FIG. 9B).

On the upstream side of each feed hook 36a to 36f, inclined surfaces 38a to 38f of the same angle θ1 are formed. When feed member 31 moves to the upstream side, inclined surfaces 38a to 38f are in contact with lead L of axial component D connected as component connected body C from the downstream side to rotate the downstream side of feed member 31 upward (refer to FIG. 10A).

In FIG. 7A, substantially horizontal projection end surfaces 39a to 39f are formed at projection end portions between feed surfaces 37a to 37f and inclined surfaces 38a to 38f in each feed hook 36a to 36f. When feed member 31 moves to the upstream side, projection end surface 39a to 39f are in contact substantially horizontally with lead L of axial component D connected as component connected body C (refer to FIG. 10B).

Between feed hooks 36a to 36f, recessed surfaces 40a to 40e are formed which are in contact substantially horizontally with lead L of axial component D connected as component connecting body C. For convenience, a substantially horizontal surface formed on the upstream side of feed hook 36f located on the most upstream side (rotating shaft 32 side) is also referred to as recessed surface 40f. In each of feed hooks 36a to 36f, the lengths from recessed surfaces 40a to 40f to projection end surfaces 39a to 39f are lengths Ha to Hf of each of feed hooks 36a to 36f.

Lengths Ha to Hf of each of feed hooks 36a to 36f are formed so as to gradually decrease from feed hook 36a on the downstream side to feed hook 36f on rotating shaft 32 side (Ha>Hb>Hc>Hd>He>Hf). That is, length H (length Hc) of one feed hook 36 of the plurality of feed hooks 36a to 36f (for example, feed hook 36c) of feed member 31 is longer than length H (length Hd) of the other feed hook 36 (for example, feed hook 36d) adjacent to rotating shaft 32 side.

FIG. 7B illustrates a state where recessed surfaces 40a to 40f are in contact with lead L of axial component D connected as component connected body C. In this state, height positions Pa to Pf of projection end surfaces 39a to 39f are formed so as to be higher in order from the downstream side toward rotating shaft 32 side (Pa<Pb<Pc<Pd<Pe<Pf).

Figure 8:
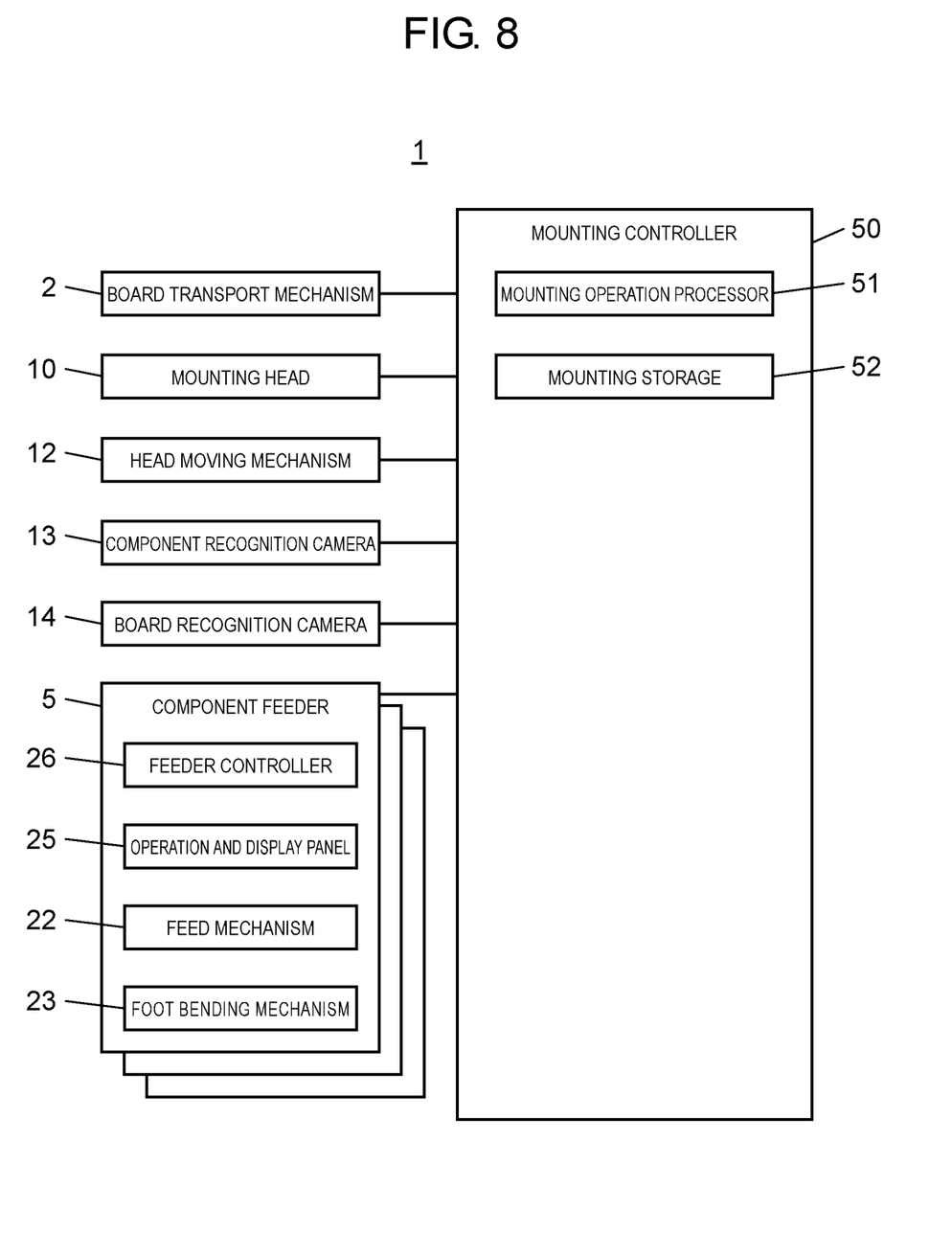
FIG. 8 is a block diagram illustrating a configuration of a control system of the component mounting device according to the exemplary embodiment of the present disclosure.

Next, the configuration of a control system of the component mounting device 1 will be described with reference to FIG. 8. Component mounting device 1 is provided with mounting controller 50, board transport mechanism 2, component feeder 5, mounting head 10, head moving mechanism 12, component recognition camera 13, and board recognition camera 14. Mounting controller 50 is provided with mounting operation processor 51 and mounting storage 52. Mounting storage 52 is a storage device, and mounting data including a type and a shape of axial component D mounted on board 3, coordinates of mounting position, and the like are stored for each type of a mounting board to be manufactured.

Mounting operation processor 51 controls each component to control the component mounting operation for mounting axial component D on board 3. Each of component feeders 5 is provided with feed mechanism 22, foot bending mechanism 23, operation and display panel 25, and feeder controller 26. Feeder controller 26 controls feed mechanism 22 to execute a component feeding operation for pitch-feeding component connected body C and controls foot bending mechanism 23 to execute the foot bending processing.

Next, with reference to FIGS. 9A to 11C, a method of manufacturing a mounting board by component mounting device 1 will be described. It is assumed that component feeder 5 is in a state (FIG. 9A) where axial component D is picked up from component supply position 5a and feed member 31 returns to the stop position on the upstream side. For convenience, in FIG. 9A to 9C, axial component D connected as component connected body C displays only lead L, and in FIGS. 10A to 10C, only lead L is displayed except for axial component D on the top (downstream side). In addition, the suffixes (a to f) attached to the reference numerals of feed hook 36 and each surface formed on feed hook 36 are not repeated in a case where there is no need to specify feed hook 36.

Figure 9A:
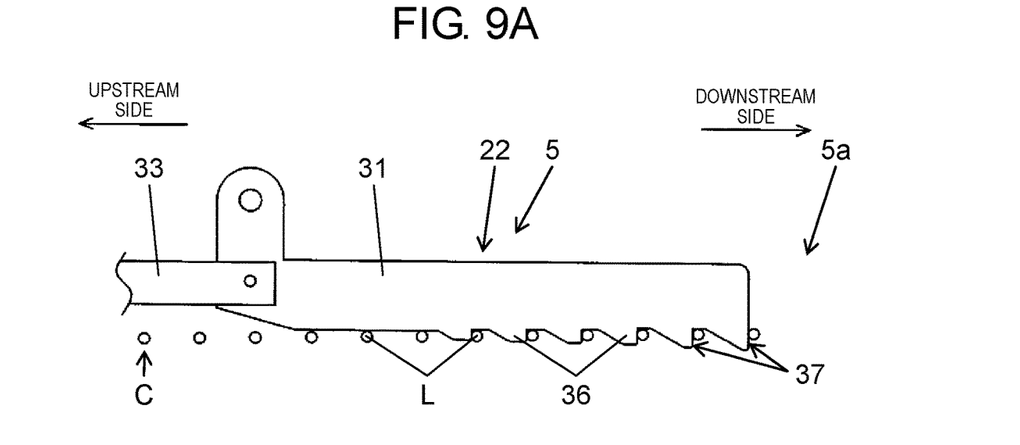
FIG. 9A is a step explanatory diagram of a component supply operation by the component supply device according to the exemplary embodiment of the present disclosure.
Figure 9B:
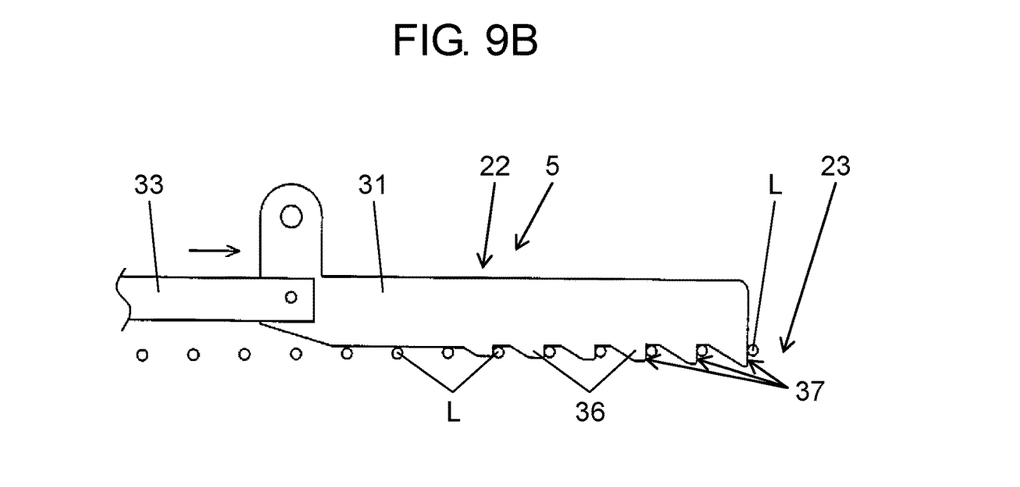
FIG. 9B is a step explanatory diagram of a component supply operation by the component supply device according to the exemplary embodiment of the present disclosure.

First, a component feeding operation is executed on component feeder 5. In component feeder 5, feed mechanism 22 moves feed member 31 to the downstream side by the moving mechanism (connecting member 33, air cylinder 34) to move component connected body C to the downstream side, in a state where feed surface 37 formed on the downstream side of each of the plurality of feed hooks 36 is in contact substantially vertically with lead L of axial component D from the upstream side (component connected body moving step) (FIG. 9B). As a result, leading axial component D is sent to foot bending mechanism 23.

Figure 9C:
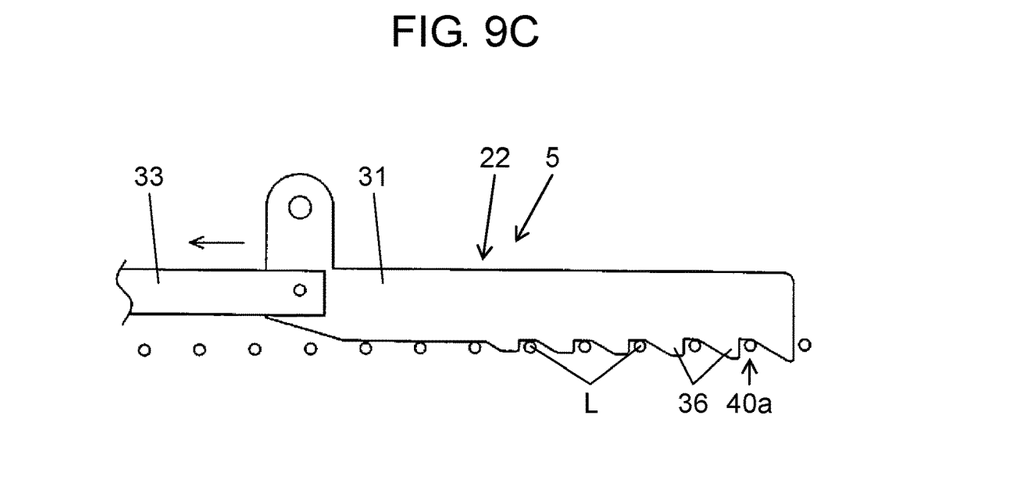
FIG. 9C is a step explanatory diagram of a component supply operation by the component supply device according to the exemplary embodiment of the present disclosure.

Next, feed mechanism 22 moves feed member 31 to the upstream side in a state where at least two recessed surfaces 40 are in contact with lead L of axial component D among recessed surfaces 40 formed between the plurality of feed hooks 36 (first moving step) (FIG. 9C). Specifically, in a case where recessed surface 40a farthest from rotating shaft 32 is in contact with lead L of axial component D, at least the other recessed surface 40 is also in contact with lead L of the other axial component D. As described above, two or more recessed surfaces 40 are in contact with lead L, and thus a load applied to lead L can be dispersed.

Figure 10A:
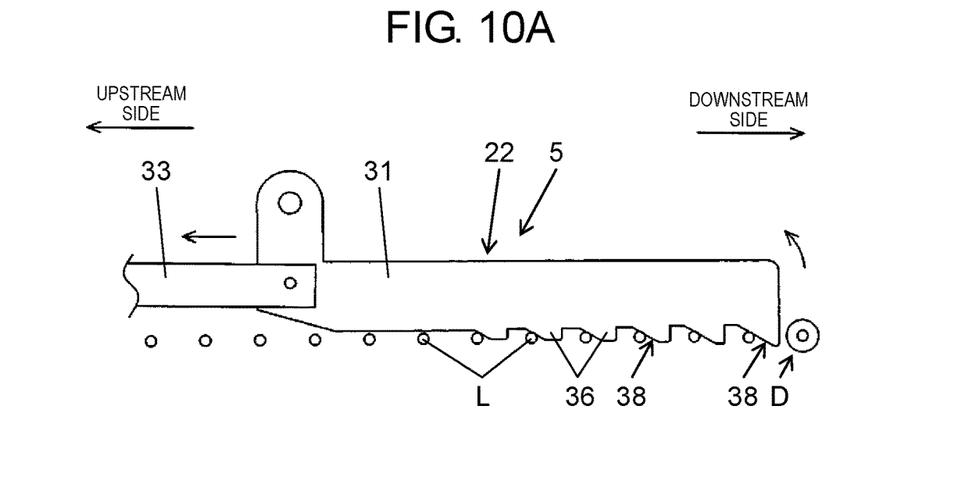
FIG. 10A is a step explanatory diagram of a component supply operation by the component supply device according to the exemplary embodiment of the present disclosure.

Next, feeding mechanism 22 moves feed member 31 to the upstream side, in a state where at least two inclined surfaces 38 are in contact with lead L of axial component D among inclined surfaces 38 formed on the upstream sides of the plurality of feeding hooks 36 (second moving step) (FIG. 10A). Inclined surface 38 is in contact with lead L from the downstream side, and thus the downstream side of feed member 31 rotates upward. At that time, two or more inclined faces 38 are in contact with lead L, and thus the load applied to lead L can be dispersed.

Figure 10B:
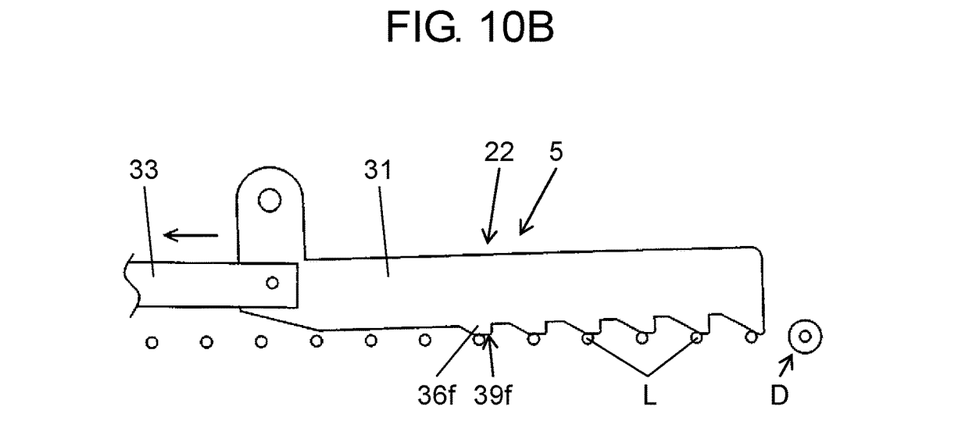
FIG. 10B is a step explanatory diagram of a component supply operation by the component supply device according to the exemplary embodiment of the present disclosure.

Next, feed mechanism 22 moves feed member 31 to the upstream side, in a state where at least two projection end surfaces 39 are in contact with lead L of axial component D among projection end surfaces 39 formed on each of the projection end portions of the plurality of feed hooks 36 (third moving step) (FIG. 10B). Specifically, in a case where projection end surface 39f of feed hook 36f closest to rotating shaft 32 is in contact with lead L of axial component D, at least one projection end surface 39 of the other feed hook 36 is also in contact with lead L of the other axial component D. As described above, two or more projection end surfaces 39 are in contact with lead L, and thus the load applied to lead L can be dispersed.

Figure 10C:
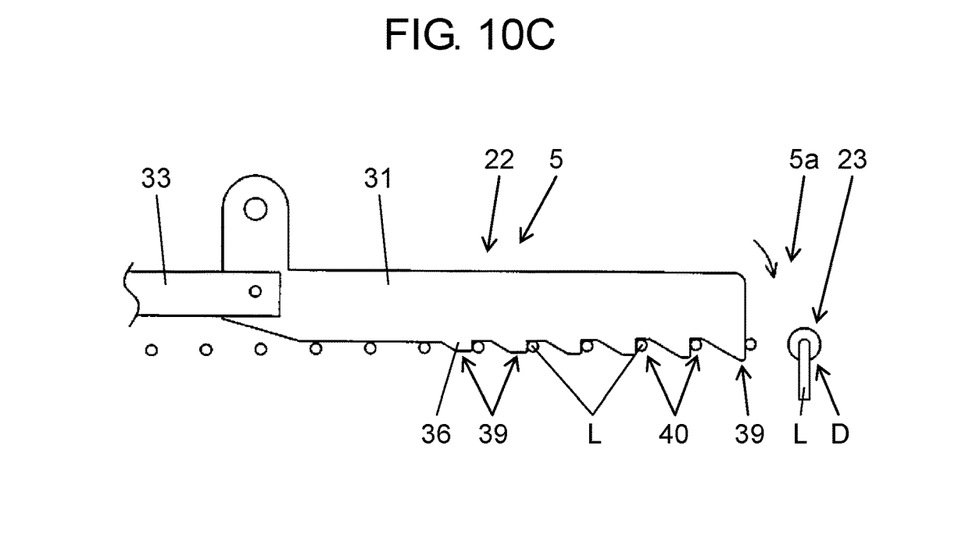
FIG. 10C is a step explanatory diagram of a component supply operation by the component supply device according to the exemplary embodiment of the present disclosure.

In FIG. 10C, when feed mechanism 22 returns feed member 31 to the stop position on the upstream side, projection end surface 39 gets over lead L and the downstream side of feed member 31 rotates downward so that feed member 31 with recessed surface 40 in contact with lead L returns to the stop position on the upstream side. As described above, a first moving step, a second moving step, and a third moving step are feed member returning steps for moving feed member 31 to the upstream side by the moving mechanism while dispersing the load applied to lead L of axial component D from feed member 31 to the plurality of leads L, and returning feed member 31 to the stop position on the upstream side. While feed member 31 moves to the upstream side, the movement of component connected body C toward the upstream side is restrained by stopper member 42 (retraction restraint mechanism).

Figure 11A:
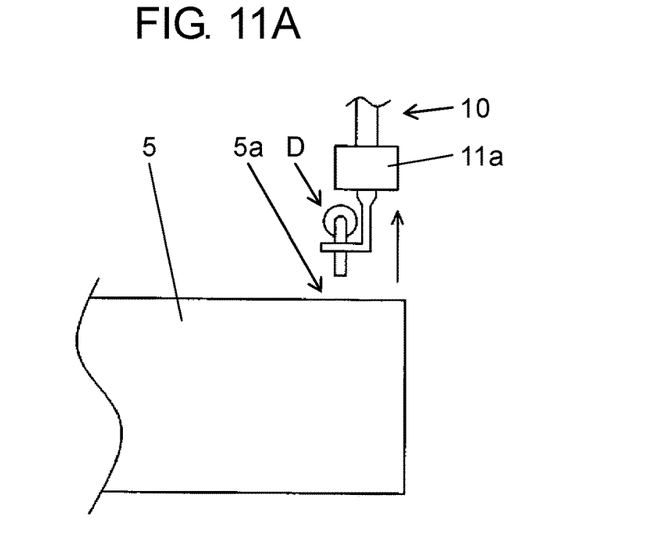
FIG. 11A is a step explanatory diagram of a component mounting operation by the component mounting device according to the exemplary embodiment of the present disclosure.

In FIG. 10C, axial component D sent to foot bending mechanism 23 by the component feeding operation is subjected to the foot bending processing by foot bending mechanism 23 (foot bending processing step). A foot bending processing step may be executed in parallel with the feed member returning step. When the foot bending processing is completed, mounting head 10 holds and picks up axial component D moved to component supply position 5a by component holder 11a (component picking up step) (FIG. 11A).

Figure 11B:
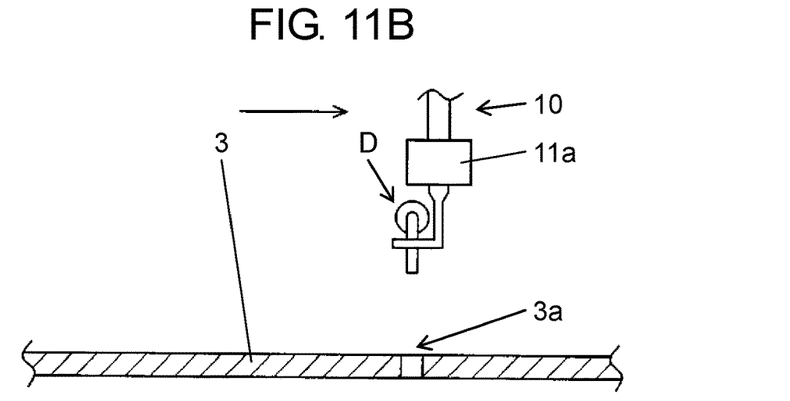
FIG. 11B is a step explanatory diagram of a component mounting operation by the component mounting device according to the exemplary embodiment of the present disclosure.
Figure 11C:
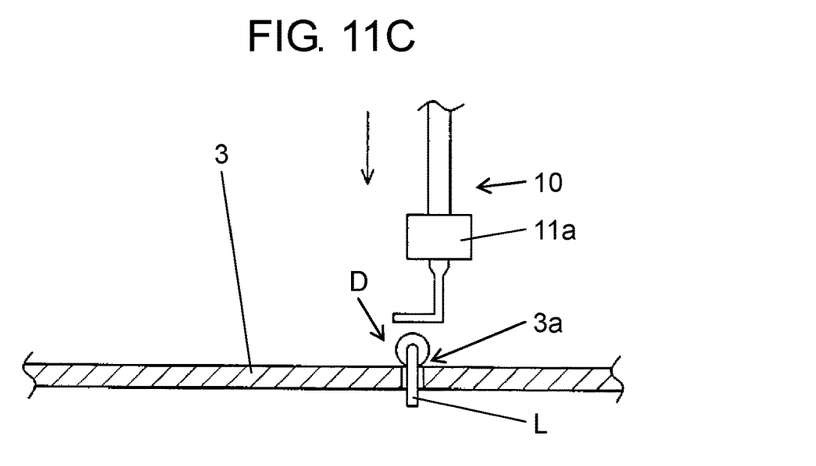
FIG. 11C is a step explanatory diagram of a component mounting operation by the component mounting device according to the exemplary embodiment of the present disclosure.

Next, head moving mechanism 12 moves mounting head 10 holding axial component D above board 3 held at the mounting operation position (mounting head moving step) (FIG. 11B). Next, mounting head 10 inserts lead L of axial component D held by component holder 11a into through-hole 3a to mount axial component D on board 3 (component mounting step) (FIG. 11C). Thereafter, the supply of axial component D by component feeder 5 and the mounting of axial component D on board 3 by mounting head 10 are repeatedly performed, and the mounting board is manufactured.

As described above, component feeder 5 (component supply device) that picks up and supplies axial component D from component connected body C of the exemplary embodiment is provided with transport path 5g that guides component connected body C from component insertion port 5e on the upstream side to component supply position 5a on the downstream side and feed mechanism 22 that pitch-feeds component connected body C along transport path 5g to the downstream side. Feed mechanism 22 is connected to one end side of feed member 31 on which the plurality of feed hooks 36 are formed at pitch Sp through rotating shaft 32 and has the moving mechanism (connecting member 33, air cylinder 34) for reciprocating rotating shaft 32 along the component feeding direction. Length H of one feed hook 36 among the plurality of feed hooks 36 is longer than length H of the other feed hook 36 adjacent to the rotating shaft 32 side. As a result, component feeder 5 can supply axial component D without bending lead L and lowering the reliability.

The component supply device, the component mounting device, and the method of manufacturing the mounting board according to the disclosure have an effect that the axial component can be supplied without lowering the reliability, and are useful in the field of mounting the component on the board.

What is claimed is:

1. A component supply device comprising:
   a transport path that guides a component connected body from a component insertion port on an upstream side in a component feeding direction to a component supply position on a downstream side, the component connected body including a plurality of axial components arranged and connected at a predetermined pitch, the plurality of axial components each having a lead; and
   a feed mechanism that pitch-feeds the component connected body along the transport path to the downstream side,
   wherein the feed mechanism includes
      a feed member which has a plurality of feed hooks disposed at the predetermined pitch along the component feeding direction,
      a rotating shaft which is connected to one end side of the feed member, and
      a moving mechanism which is connected to the feed member through the rotating shaft and reciprocates the rotating shaft along the component feeding direction, and
   a length of one feed hook among the plurality of feed hooks is longer in a vertical direction than a length of an other feed hook in the vertical direction among the plurality of feed hooks, the other feed hook being adjacent to the one feed hook on the rotating shaft side.

2. The component supply device of claim 1,
   wherein each of the plurality of the feed hooks has a feed surface on the downstream side, and
   when the feed member moves to the downstream side, the feed surface is in contact substantially perpendicularly with the lead from the upstream side to move the component connected body to the downstream side.

3. The component supply device of claim 1,
   wherein each of the plurality of feed hooks has an inclined surface on the upstream side, and
   when the feed member moves to the upstream side, the inclined surface is in contact with the lead from the downstream side to rotate the feed member.

4. The component supply device of claim 3,
   wherein the inclined surface of each of the plurality of feed hooks is inclined at an identical angle in the component feeding direction.

5. The component supply device of claim 1,
   wherein a projection end portion of each of the plurality of feed hooks has a projection end surface, and
   when the feed member moves to the upstream side, the projection end surface is in contact substantially parallel with the lead.

6. The component supply device of claim 5,
   wherein when the projection end surface of a feed hook closest to the rotating shaft is in contact with the lead of one axial component, the projection end surface of an other feed hook is also in contact with the lead of an other axial component.

7. The component supply device of claim 1,
   wherein the feed member has a recessed surface which is in contact with the lead between the plurality of feed hooks.

8. The component supply device of claim 7,
   wherein when the recessed surface of a feed hook farthest from the rotating shaft is in contact with the lead of one axial component, the recessed surface of an other feed hook is also in contact with the lead of an other axial component.

9. The component supply device of claim 1, further comprising:
   a retraction restraint mechanism that does not hinder movement of the component connected body to the downstream side and restrains movement to the upstream side.

10. A component mounting device comprising:
    the component supply device of claim 1; and
    a mounting head that holds the plurality of axial components supplied by the component supply device to mount the axial components on a board.

11. The component supply device of claim 1, wherein the length of one feed hook and the length of the other feed hook extend in a direction transverse to the downstream side.

* * * * *